US007380228B2

(12) United States Patent
Fry et al.

(10) Patent No.: US 7,380,228 B2
(45) Date of Patent: May 27, 2008

(54) METHOD OF ASSOCIATING TIMING VIOLATIONS WITH CRITICAL STRUCTURES IN AN INTEGRATED CIRCUIT DESIGN

(75) Inventors: Randall P. Fry, Greenville, NC (US); Gregory Pierce, Ashby, MA (US); Juergen Lahner, Morgan Hill, CA (US)

(73) Assignee: LSI Corporation, Milpitas, CA (US)

( * ) Notice: Subject to any disclaimer, the term of this patent is extended or adjusted under 35 U.S.C. 154(b) by 378 days.

(21) Appl. No.: 10/984,115

(22) Filed: Nov. 8, 2004

(65) Prior Publication Data

US 2006/0101363 A1    May 11, 2006

(51) Int. Cl.
G06F 9/45 (2006.01)
G06F 17/50 (2006.01)

(52) U.S. Cl. ............... 716/6; 716/4; 716/5; 716/10; 716/18; 703/19

(58) Field of Classification Search ............ 716/2, 716/4, 6, 10, 11, 18; 703/19
See application file for complete search history.

(56) References Cited

U.S. PATENT DOCUMENTS

| | | | | |
|---|---|---|---|---|
| 5,544,071 A * | 8/1996 | Keren et al. | ............ | 716/6 |
| 5,870,309 A * | 2/1999 | Lawman | ............ | 716/6 |
| 5,930,147 A * | 7/1999 | Takei | ............ | 716/8 |
| 6,058,252 A * | 5/2000 | Noll et al. | ............ | 716/10 |
| 6,272,668 B1 * | 8/2001 | Teene | ............ | 716/10 |
| 6,427,226 B1 * | 7/2002 | Mallick et al. | ............ | 716/10 |
| 6,539,536 B1 * | 3/2003 | Singh et al. | ............ | 716/18 |
| 6,742,165 B2 * | 5/2004 | Lev et al. | ............ | 716/1 |
| 6,799,308 B2 * | 9/2004 | You et al. | ............ | 716/6 |
| 6,910,166 B2 * | 6/2005 | Suzuki et al. | ............ | 714/741 |
| 6,910,194 B2 * | 6/2005 | Mielke et al. | ............ | 716/6 |
| 6,996,515 B1 * | 2/2006 | Foltin et al. | ............ | 703/19 |
| 7,000,205 B2 * | 2/2006 | Devgan et al. | ............ | 716/6 |
| 7,047,506 B2 * | 5/2006 | Neves et al. | ............ | 716/2 |
| 7,055,121 B1 * | 5/2006 | Bolander et al. | ............ | 716/11 |
| 7,082,584 B2 * | 7/2006 | Lahner et al. | ............ | 716/4 |
| 7,107,558 B2 * | 9/2006 | Tetelbaum et al. | ............ | 716/6 |
| 7,143,379 B2 * | 11/2006 | Darsow et al. | ............ | 716/6 |
| 7,194,715 B2 * | 3/2007 | Charlebois et al. | ............ | 716/6 |
| 7,216,318 B1 * | 5/2007 | Siarkowski | ............ | 716/6 |
| 2005/0149790 A1 * | 7/2005 | Yoshida et al. | ............ | 714/724 |
| 2005/0246673 A1 * | 11/2005 | Charlebois et al. | ............ | 716/6 |
| 2005/0251775 A1 * | 11/2005 | Wood | ............ | 716/10 |
| 2005/0268258 A1 * | 12/2005 | Decker | ............ | 716/4 |
| 2006/0064659 A1 * | 3/2006 | Ushiyama et al. | ............ | 716/6 |

OTHER PUBLICATIONS

NN9211233, "Algorithm for Logic Block Power Level Optimization Based on Timing Slack", Nov. 1, 1992, IBM Technical Disclosure Bulletin, vol. No. 35, Issue No. 6, p. No. 233-241 ☐☐.*

* cited by examiner

*Primary Examiner*—Helen Rossoshek
(74) *Attorney, Agent, or Firm*—Eric James Whitesell

(57) ABSTRACT

A method and computer program product for associating timing violations with critical structures in an integrated circuit design include steps of: (a) receiving as input an integrated circuit design; (b) identifying a critical structure in the integrated circuit design; and (c) generating as output a script for a static timing analysis tool that includes a timing check for a path having a start point at an input of the critical structure and an end point at an output of the critical structure.

14 Claims, 2 Drawing Sheets

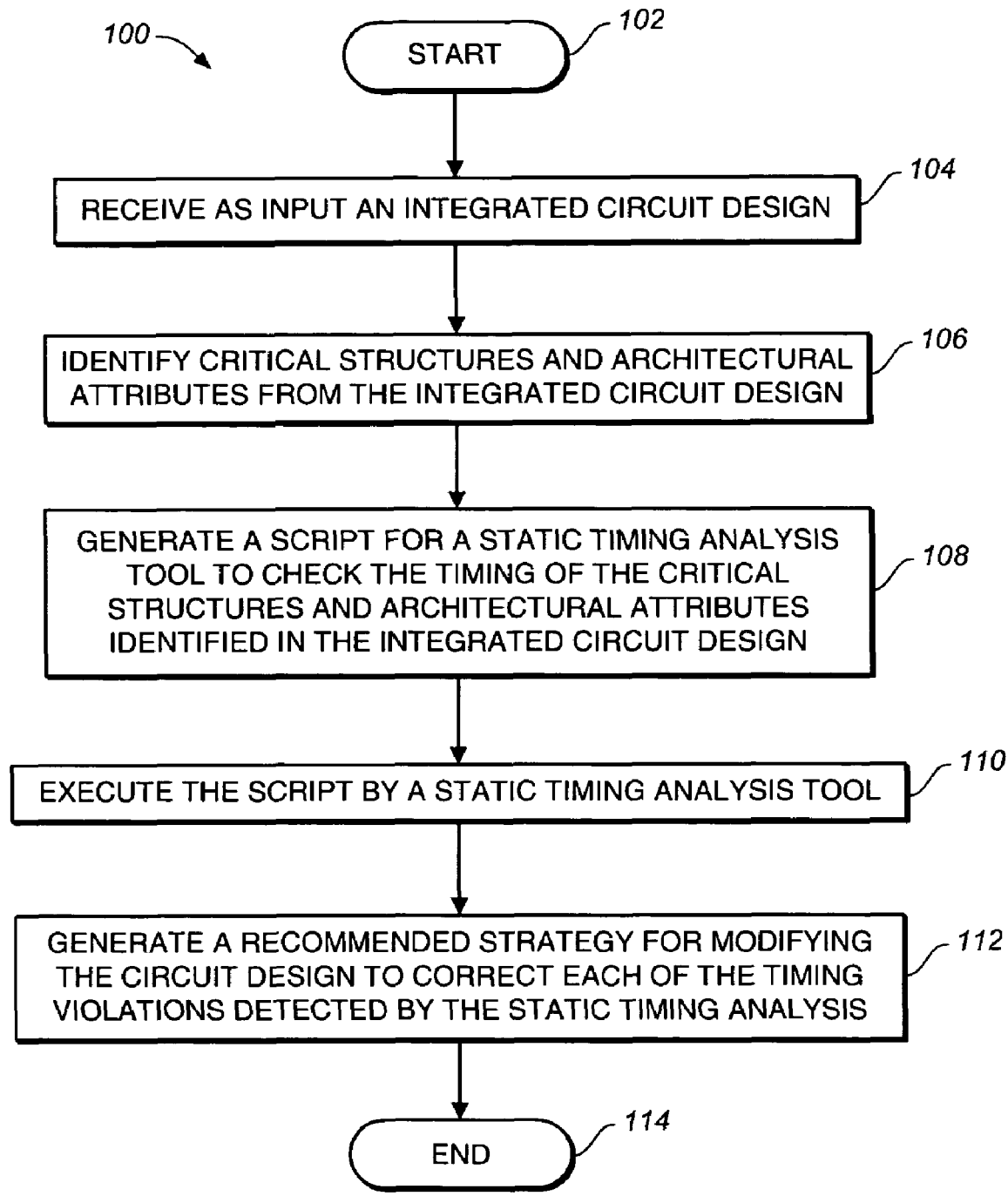
FIG._1

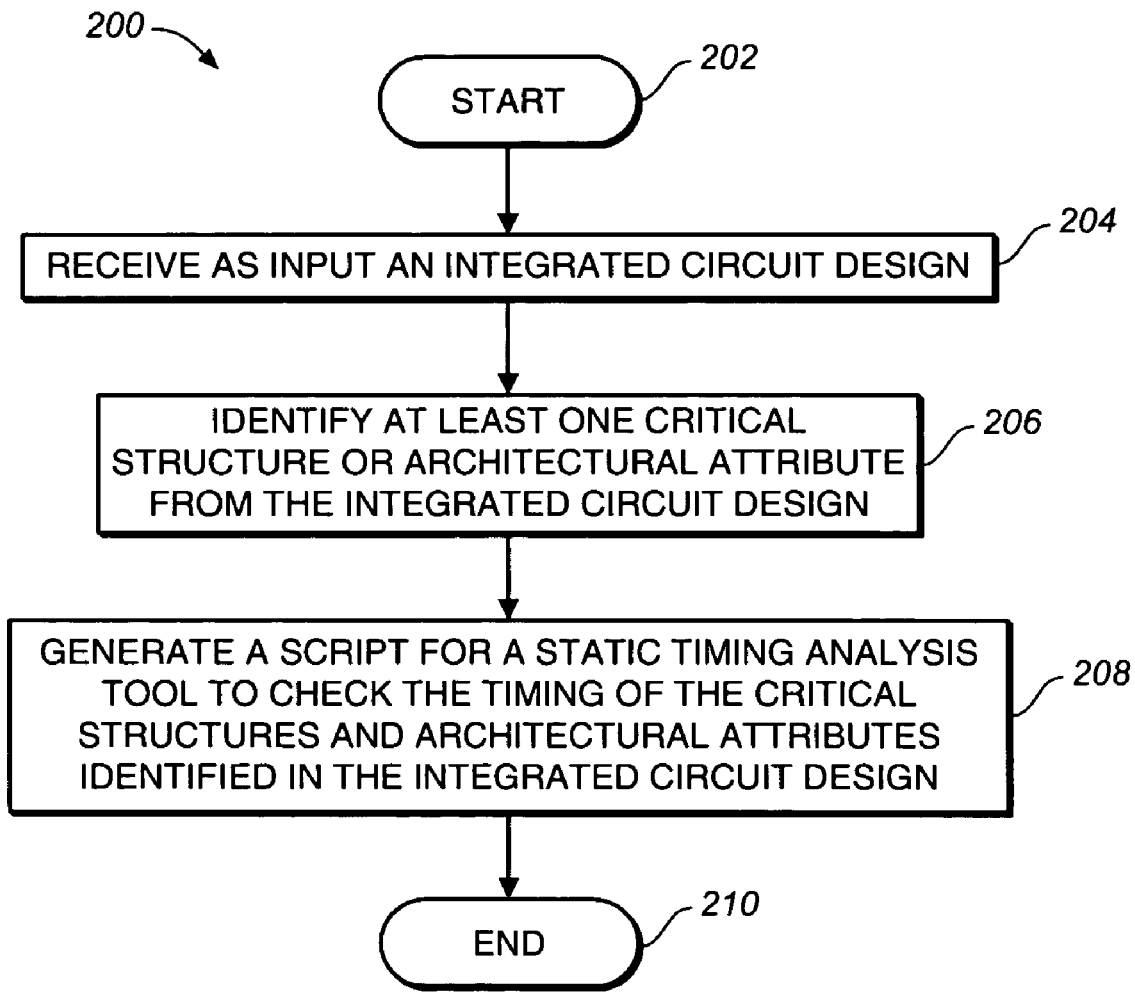
FIG._2

METHOD OF ASSOCIATING TIMING VIOLATIONS WITH CRITICAL STRUCTURES IN AN INTEGRATED CIRCUIT DESIGN

BACKGROUND OF THE INVENTION

1. Field of the Invention

The present invention is directed to application specific integrated circuit (ASIC) designs. More specifically, but without limitation thereto, the present invention is directed to identifying and correcting timing problems in register transfer level (RTL) code for an integrated circuit design.

2. Description of the Prior Art

Previous approaches to correcting design defects in application specific integrated circuit (ASIC) designs require a significant amount of time analyzing the back-end flow, or layout, of the ASIC design. Attempting to resolve design problems at this stage in the design typically increases turnaround time (TAT) and jeopardizes schedule commitments.

Static timing analysis (STA) and timing closure are used to identify and correct timing violations in an integrated circuit design as quickly as possible to conserve valuable engineering resources and to meet production schedules. Timing violations that are identified in static timing analysis are resolved according to timing closure methods to ensure that the integrated circuit design will work in silicon according to design specifications.

SUMMARY OF THE INVENTION

In exemplary embodiments, a method and computer program product for associating timing violations with critical structures in an integrated circuit design include steps of:
  (a) receiving as input an integrated circuit design;
  (b) identifying a critical structure in the integrated circuit design; and
  (c) generating as output a script for a static timing analysis tool that includes a timing check for a path having a start point at an input of the critical structure and an end point at an output of the critical structure.

BRIEF DESCRIPTION OF THE DRAWINGS

The embodiments described herein are illustrated by way of example and not limitation in the accompanying figures, in which like references indicate similar elements throughout the several views of the drawings, and in which:

FIG. 1 illustrates a flow chart for a method of associating timing violations with critical structures in an integrated circuit design; and FIG. 2 illustrates a flow chart of a computer program product for associating timing violations with critical structures in an integrated circuit design from the method of FIG. 1.

Elements in the figures are illustrated for simplicity and clarity and have not necessarily been drawn to scale. For example, the dimensions of some elements in the figures may be exaggerated relative to other elements to point out distinctive features in the illustrated embodiments.

To simplify referencing in the description of the illustrated embodiments of the present invention, indicia in the figures may be used interchangeably to identify both the signals that are communicated between the elements and the connections that carry the signals. For example, an address communicated on an address bus may be referenced by the same number used to identify the address bus.

DESCRIPTION OF THE ILLUSTRATED EMBODIMENTS

Previous methods of resolving timing violations lack an efficient and organized procedure to analyze all timing violations reported by a static timing analysis tool, to determine the root causes of the timing violations, and to converge on a solution that resolves the timing violations. Timing problems encountered during static timing analysis may be induced by architectural and structural attributes of the integrated circuit design at the highest level of the design in the register transfer level code, that is, the integrated circuit design may include a logical implementation that is not realistic from a performance standpoint. For example, if the design reads data from a memory and performs operations on the data with logic gates such as exclusive-OR and so on before the data is registered by sampling the data in a flip-flop, and if the target clock frequency is too high, then the logical implementation is unrealistic in terms of performance, and timing closure of the design may not be possible after cell placement and routing. Other timing violations may be induced by inefficiencies in netlist synthesis, a sub-optimal floorplan, and/or poor placement and routing.

An analysis of an individual path that includes a timing violation may require that the circuit designer check a schematic to find the source of the timing violation. However, the overall timing scheme is frequently difficult to visualize when individual endpoints, that is, the primary outputs of the design, are the entire focus of the design. Additionally, the more timing violations reported by the static timing analysis, the more difficult the timing closure will be. For example, in a static timing analysis of an integrated circuit design containing one million gates, there may be tens of thousands of timing violations reported, and it is the responsibility of the circuit designer to trace through the timing reports and circuit schematics to determine which blocks and cells caused the timing violations. Even then, the root cause of the timing violations, that is, the architectural or structural cause, may be overlooked, in which case each individual path is typically manually examined with a schematic browser, consuming valuable schedule time and resources. This trial-and-error approach is extremely time consuming at best, and is not always successful. As a result, a significant amount of development resources must be assigned to static timing analysis and timing closure while at the same time assuming a high risk of failure to meet a design schedule.

Design engineers who perform static timing analysis generally rely on the various negative slack timing reports generated by a static timing analysis tool, checking each timing report to develop a plan to close timing for each timing violation identified. A preferable approach from the design time cost standpoint would be to categorize the timing violations into structure types and to proactively check timing of paths in the register transfer level code that include structures that may potentially be a source of timing problems. Examples of structure types in register transfer level code that are potential sources of timing problems include memory interfaces (I/F), coreware interfaces, input/output (I/O) interfaces, fan-in logic cones, fan-out logic cones, large multiplexers, and high fanout nets. By categorizing timing violations into structure types, the cycle of finding a solution to one timing problem that often introduces another timing problem may be advantageously avoided.

The embodiments described below provide a method of identifying structure types in register transfer level code in a script for a static timing analysis tool to determine whether any of the identified structures or architectural attributes account for any of the negative timing slack problems encountered during static timing analysis. Additionally, a report is generated from the static timing analysis that categorizes the timing violations to the extent made possible by various statistics. The categorized information may be used to assist the circuit designer in visualizing the timing problems so that a well-structured and efficient plan for timing closure may be developed.

Categorizing timing violations based on the structural and architectural attributes in the register transfer level code of a circuit design is an extremely powerful tool for visualizing the timing problems that have to be resolved in timing closure and for developing an effectively organized and prioritized plan for achieving timing closure. For example, depending on the magnitude and number of timing issues, architectural and/or register transfer level code modifications may have to be made, a modification to netlist synthesis may have to be made, an alternative floorplan may have to be implemented, and a different approach to placement and routing may have to be made to shift physical resources to the more timing critical areas of the integrated circuit design.

In one embodiment, a method of associating timing violations with critical structures in an integrated circuit design includes steps of:

(a) receiving as input an integrated circuit design;
(b) identifying a critical structure in the integrated circuit design; and
(c) generating a script for a static timing analysis tool to check timing of a path in the integrated circuit design having a start point at an input of the critical structure and an end point at an output of the critical structure.

FIG. 1 illustrates a flow chart 100 for a method of associating timing violations with critical structures in an integrated circuit design.

Step 102 is the entry point of the flow chart 100.

In step 104, an integrated circuit design is received as input. The integrated circuit design may be, for example, the register transfer level code or a netlist for an application specific integrated circuit (ASIC) design or any other type of circuit design that may be expressed in register transfer level code.

In step 106, critical structures and architectural attributes are identified from the integrated circuit design, for example, by a register transfer level code analysis tool according to a set of design rules. A critical structure or architectural attribute is defined as a structure or design feature that is likely to result in a timing violation during netlist synthesis, cell placement and routing, or timing closure. Specifically, a critical structure is defined as a structure or design feature that violates an integrated circuit design rule.

A register transfer level code analysis tool incorporating circuit design rules for the integrated circuit design may be selected, for example, from a library of RTL analysis tools for a variety of ASIC vendors. The vendor may be determined, for example, by an identifier in the RTL code or from a setup file. The RTL analysis tool reads the RTL code, for example, in Verilog format or Verilog Hardware Description Language (VHDL) format and performs a design check on the RTL code according to a set of design rules that include, for example, structural rule checking and timing related rule checking. Examples of design rules that may be implemented in the RTL analysis tool according to well known computer techniques include, but are not limited to, the following:

Rule: Critical Paths

The critical paths rule identifies, for example, the paths for which the maximum allowed time required by the performance specifications minus the calculated path time is less than zero, that is, negative slack. Negative slack may be caused, for example, by large structures in the critical path. Potentially problematic non-critical structures are also identified having a slack that is less than five percent of the nominal clock rate.

Rule: Large Structures

The large structures rule identifies, for example, large multiplexers in the circuit design having an input bus width exceeding a selected threshold. A default value for the bus width threshold may be, for example, 64. If there is a 2:1 multiplexer having an input bus width greater than 64, this would be reported as a critical structure. Large multiplexers may result in a design problem during layout.

Rule: High Fan-out Nets

The high fan-out nets rule identifies as critical any paths that include nets that have a fan-out exceeding a selected threshold value specific to the circuit design.

Rule: Logical Cone (Fan-in)

The Logical cone (fan-in) rule identifies as critical structures flip-flops in the RTL code having a fan-in of more than, for example, 500 starting points.

Because each register is considered as a function of its inputs, a large number of starting points requires a large number of input vectors to verify the testability of the circuit design. Also, there will be a large amount of logic connected to the register at the end point, which may result in high congestion and extra buffering to compensate for non-ideal placement. Further, a large logical cone fan-in may result in timing closure problems if the starting points are all near the critical path limit, because the delay of one logic path may not be shortened without increasing the delay of another.

Rule: Logical Cone (Fan-out)

The Logical cone (fan-out) rule reports as critical structures any flip-flops in the RTL code having a fan-out of more than, for example, 500 ending points.

A large number of ending points increases the difficulty of verifying the testability of the circuit design. Also, there will be a large amount of logic connected to the register at the starting point, which may result in high congestion and extra buffering to compensate for non-ideal placement. Further, a large logical cone fan-out may result in timing closure problems if the ending points are all near the critical path limit, because the delay of one logic path may not be shortened without increasing the delay of another.

Rule: Large Arithmetic Operators

The large arithmetic operators rule identifies as critical structures any arithmetic structures such as adders, subtractors, multipliers, bitwise AND, bitwise OR, and OR/XOR trees having a number of inputs exceeding a selected threshold, for example, 64. The number of inputs is calculated by multiplying the number of input channels times the bit width of each channel.

In step 108, a script is generated for a static timing analysis tool according to well known computer programming techniques to check the timing of the critical structures and architectural attributes identified in the integrated circuit design. For example, if a multiplexer is identified as a critical structure during the register transfer level code analysis, then the following script may be generated for a static timing analysis tool:

Check timing:<Start point>TO<End point> where the start point is an input of the multiplexer and the end point is the output of the multiplexer.

In step 110, the script generated for the critical structures in step 108 is executed by a static timing analysis tool after the master script for the entire circuit design has been run to detect timing violations associated with the critical structures and architectural attributes identified in the integrated circuit design. In the example of the critical multiplexer above, any negative slack paths involving the start points and end points surrounding the multiplexing structure will be reported in the static timing analysis. Also, potentially problematic end points may be identified in the register transfer level code and cross-referenced to negative slack end points found in the static timing analysis. Accordingly, whenever there is a negative timing slack for any timing path that includes a critical structure or end point identified in the register transfer level code from the register transfer code analysis, then a timing violation report will be generated for each instance. The following examples of additional information and statistics may also be generated:

(1) the source of the timing violation as it relates to the register transfer level code associated with each timing violation reported by the static timing analysis; and (2) the total number of paths in the register transfer level code having negative slack and a breakdown of the paths according to category of structure or architectural attribute as a percentage of the total, for example, a register transfer level code analysis script executed by a static timing analysis tool might generate the following category breakdown illustrated in Table 1:

TABLE 1

| large fan-in logic cones: | 256 (5%) |
| large fanout logic cones: | 12,353 (25%) |
| memory/coreware I/F paths: | 1,444 (15%) |
| input/output I/F paths: | 852 (9%) |
| large multiplex structures: | 8,456 (33%) |
| structural bottlenecks: | 856 (10%) |
| large register arrays: | 86 (1%) |
| large arithmetic structures: | 88 (1%) |

The category breakdown of Table 1 may provide insight in to the overall timing issues to assist the circuit designer in the development of an effectively organized and structured plan to achieve timing closure.

In step 112, a recommended strategy is generated for modifying the circuit design to correct each of the timing violations detected by the static timing analysis associated with the category of the design rule violation from the register transfer code analysis. For example, large sequential arithmetic elements may be partitioned into smaller parallel arithmetic elements to reduce the delay; large centralized multiplexer structures may be partitioned into smaller local multiplexer structures; and so on.

Step 114 is the exit point of the flow chart 100.

The steps described above with regard to the flow chart 100 may also be implemented by instructions performed on a computer according to well-known programming techniques.

In another embodiment, a computer program product includes a medium for embodying a computer program for input to a computer and a computer program embodied in the medium for causing the computer to perform steps of:

(a) receiving as input an integrated circuit design;

(b) identifying a critical structure in the integrated circuit design; and (c) generating as output a script for a static timing analysis tool that includes a timing check for a path having a start point at an input of the critical structure and an end point at an output of the critical structure.

FIG. 2 illustrates a flow chart 200 of a computer program product for associating timing violations with critical structures in an integrated circuit design from the method of FIG. 1.

Step 202 is the entry point of the flow chart 200.

In step 204, an integrated circuit design is received as input.

In step 206, at least one critical structure or architectural attribute is identified in the integrated circuit design, for example, by analyzing the register transfer level code according to a selected set of design rules. As explained above, a critical structure is defined as a structure or design feature that violates an integrated circuit design rule.

In step 208, a script for a static timing analysis tool is generated as output that includes a timing check for a path having a start point at an input of the critical structure and an end point at an output of the critical structure. Steps 206 and 208 may be repeated to identify all the critical structures in the integrated circuit design and to include a timing check for each critical structure in the script for the static timing analysis tool. Any timing violations detected by the static timing analysis tool from the script may then be associated with the corresponding critical structure so that the efforts made to correct the integrated circuit design may be properly directed to avoid generating additional timing violations.

Step 210 is the exit point of the flow chart 200.

Although the methods illustrated by the flowchart descriptions above are described and shown with reference to specific steps performed in a specific order, these steps may be combined, sub-divided, or reordered without departing from the scope of the claims. Unless specifically indicated herein, the order and grouping of steps is not a limitation.

The method of associating a timing violation with a critical structure in an integrated circuit design described above pro-actively drives the static timing analysis to achieve timing closure more efficiently than methods that do not associate timing violations with specific structures in the register transfer level code.

The specific embodiments and applications thereof described above are for illustrative purposes only and do not preclude modifications and variations that may be made thereto by those skilled in the art within the scope of the following claims.

What is claimed is:

1. A method comprising steps of:

receiving as input register transfer level (RTL) code for an integrated circuit design;

identifying a critical structure from the register transfer level (RTL) code, the critical structure comprising a structure that violates an integrated circuit design rule;

generating as output a script for a static timing analysis tool that includes a timing check for a path having a start point at an input of the critical structure and an end point at an output of the critical structure for each critical structure identified from the register transfer level (RTL) code;

executing the script on a static timing analysis tool to associate a timing violation with the critical structure;

categorizing the timing violation according to a type of the critical structure; and generating as output a static timing analysis report of the timing violation and the associated critical structure.

2. The method of claim 1 further comprising steps of: identifying a structure from the register transfer level (RTL) code not identified as a critical structure and having a timing slack that is less than five percent of a nominal clock rate; and including in the script a timing check for a path having an end point associated with an output of the structure not identified as a critical structure.

3. The method of claim 2 further comprising a step of executing the script on a static timing analysis tool to associate a timing violation with the output of the structure not identified as a critical structure.

4. The method of claim 3 further comprising a step of generating as output a static timing analysis report of the timing violation and the associated structure not identified as a critical structure.

5. The method of claim 4 further comprising a step of generating as output a recommendation for modifying the integrated circuit design to correct the timing violation according to a category of the structure not identified as a critical structure.

6. The method of claim 1, the step of identifying a critical structure comprising identifying at least one of a multiplexer having an input bus width that exceeds a selected threshold, a net that has a fan-out that exceeds a selected threshold, a net that has a fan-in that exceeds a selected number of start points, a net that has a fan-out that exceeds a selected number of end points, and an arithmetic structure that has a number of inputs that exceeds a selected threshold.

7. The method of claim 1 further comprising a step of generating a report of a number of timing violations in the register transfer level code for critical structures including fan-in logic cones, fan-out logic cones, memory/coreware, inputs, outputs, multiplexers, bottlenecks, register arrays, and arithmetic structures.

8. A computer readable storage medium tangibly embodying instructions for a computer that when executed by the computer implement a method comprising steps of:

receiving as input register transfer level (RTL) code for an integrated circuit design;

identifying a critical structure from the register transfer level (RTL) code, the critical structure comprising a structure that violates an integrated circuit design rule;

generating as output a script for a static timing analysis tool that includes a timing check for a path having a start point at an input of the critical structure and an end point at an output of the critical structure for each critical structure identified from the register transfer level (RTL) code;

executing the script on a static timing analysis tool to associate a timing violation with the critical structure;

categorizing the timing violation according to a type of the critical structure; and generating as output a static timing analysis report of the timing violation and the associated critical structure.

9. The computer readable storage medium of claim 8 further comprising steps of: identifying a structure from the register transfer level (RTL) code not identified as a critical structure and having a timing slack that is less than five percent of a nominal clock rate; and including in the script a timing check for a path having an end point associated with an output of the structure not identified as a critical structure.

10. The computer readable storage medium of claim 9 further comprising a step of executing the script on a static timing analysis tool to associate a timing violation with the output of the structure not identified as a critical structure.

11. The computer readable storage medium of claim 10 further comprising a step of generating as output a static timing analysis report of the timing violation and the associated structure not identified as a critical structure.

12. The computer readable storage medium of claim 11 further comprising a step of generating as output a recommendation for modifying the integrated circuit design to correct the timing violation according to a category of the structure not identified as a critical structure.

13. The computer readable storage medium of claim 8, the step of identifying a critical structure comprising identifying at least one of a multiplexer having an input bus width that exceeds a selected threshold, a net that has a fan-out that exceeds a selected threshold, a net that has a fan-in that exceeds a selected number of start points, a net that has a fan-out that exceeds a selected number of end points, and an arithmetic structure that has a number of inputs that exceeds a selected threshold.

14. The computer readable storage medium of claim 8 further comprising a step of generating a report of a number of timing violations in the register transfer level code for critical structures including fan-in logic cones, fan-out logic cones, memory/coreware, inputs, outputs, multiplexers, bottlenecks, register arrays, and arithmetic structures.

* * * * *